(12) United States Patent
Shih

(10) Patent No.: US 11,991,852 B2
(45) Date of Patent: May 21, 2024

(54) TRAY AND ELECTRONIC DEVICE

(71) Applicant: Wistron Corp., New Taipei (TW)

(72) Inventor: Ming Chih Shih, New Taipei (TW)

(73) Assignee: Wistron Corp., New Taipei (TW)

( * ) Notice: Subject to any disclaimer, the term of this patent is extended or adjusted under 35 U.S.C. 154(b) by 0 days.

(21) Appl. No.: 17/883,484

(22) Filed: Aug. 8, 2022

(65) Prior Publication Data

US 2023/0389213 A1 Nov. 30, 2023

(30) Foreign Application Priority Data

May 25, 2022 (TW) .................................. 111119365

(51) Int. Cl.
*H05K 7/14* (2006.01)
*H05K 5/02* (2006.01)

(52) U.S. Cl.
CPC .......... *H05K 7/1489* (2013.01); *H05K 5/023* (2013.01); *H05K 7/1487* (2013.01)

(58) Field of Classification Search
CPC .... H05K 7/1489; H05K 7/1487; H05K 5/023; H05K 5/0221; G06F 1/187; G06F 1/183
See application file for complete search history.

(56) References Cited

U.S. PATENT DOCUMENTS

| | | | | |
|---|---|---|---|---|
| 9,826,658 | B1 * | 11/2017 | Mao | G06F 1/183 |
| 10,251,300 | B1 * | 4/2019 | Mao | H05K 7/1487 |
| 10,470,334 | B1 * | 11/2019 | Mao | H05K 7/1489 |
| 10,863,644 | B1 * | 12/2020 | Tseng | H05K 7/1487 |
| 2020/0146185 | A1 * | 5/2020 | Wu | H05K 7/20172 |
| 2020/0396859 | A1 * | 12/2020 | Liu | G11B 33/128 |
| 2022/0377926 | A1 * | 11/2022 | Wang | H05K 5/023 |

FOREIGN PATENT DOCUMENTS

| | | |
|---|---|---|
| TW | M314501 U | 6/2007 |
| TW | 201240580 A | 10/2012 |
| TW | 202001483 A | 1/2020 |
| TW | 202046845 A | 12/2020 |
| TW | M619978 U | 11/2021 |

* cited by examiner

*Primary Examiner* — Kimberley S Wright

(57) ABSTRACT

A tray is provided for an electronic device, and the tray includes: a base, a connecting rod, a bracket, and a linkage member. The base has a bottom surface and a sidewall that is connected to the bottom surface. The connecting rod is rotatably disposed on the sidewall of the base. The bracket is disposed adjacent to the base. The linkage member is disposed on the connecting rod and movably connected to the bracket. The tray is moved relatively to the electronic device by the linking member through the connecting rod selectively. Accordingly, the base can move between different positions, thereby helping to install or remove the tray.

20 Claims, 10 Drawing Sheets

US 11,991,852 B2

1

TRAY AND ELECTRONIC DEVICE

CROSS REFERENCE TO RELATED APPLICATIONS

This application claims priority of Taiwan Patent Application No. 111119365, filed on May 25, 2022, the entirety of which is incorporated by reference herein.

BACKGROUND

Technical Field

The disclosure relates to a tray and an electronic device, and in particular to a tray and an electronic device that are capable of switching between different states.

Description of the Related Art

With the development of technology, the application of electronic apparatus is becoming more and more popular. Large electronic apparatuses, such as computers and servers, have gradually become an indispensable part of daily life. An electronic apparatus is usually provided with electronic devices (e.g., a chassis), to accommodate additional electronic components and provide extended functionality, for example. However, there is still room for improvement in making the installation and maintenance of existing electronic devices more convenient.

BRIEF SUMMARY

The present disclosure provides a tray. The tray is provided for an electronic device, and the tray includes a base, a connecting rod, a bracket, and a linkage member. The base has a bottom surface and a sidewall that is connected to the bottom surface. The connecting rod is rotatably disposed on the sidewall of the base. The bracket is disposed adjacent to the base. The linkage member is disposed on the connecting rod. The linkage member is movably connected to the bracket and the connecting rod. The tray is moved relatively to the electronic device by the linking member through the connecting rod selectively.

The present disclosure provides an electronic device. The electronic device includes a chassis and a tray that is removably disposed in the chassis. The tray includes a base that has a bottom surface and a sidewall connected to the bottom surface. The tray also includes a connecting rod that is rotatably disposed on the sidewall of the base. The tray includes a bracket disposed adjacent to the base. The tray further includes a linking member that is disposed on the connecting rod and movably connected to the bracket. The tray is moved relatively to the electronic device by the linking member through the connecting rod selectively The present disclosure provides a tray. The tray includes a base that has a bottom surface and a sidewall connected to the bottom surface. The tray also includes a connecting rod that is rotatably disposed on the sidewall of the base. The tray includes a bracket disposed adjacent to the base. The tray further includes a linking member that is disposed on the connecting rod and movably connected to the bracket. The tray is driven for a relative motion between the base and the bracket by the linking member through the connecting rod selectively.

BRIEF DESCRIPTION OF THE DRAWINGS

The disclosure may be more fully understood by reading the subsequent detailed description and examples with references made to the accompanying drawings, wherein:

2

Figure 1:
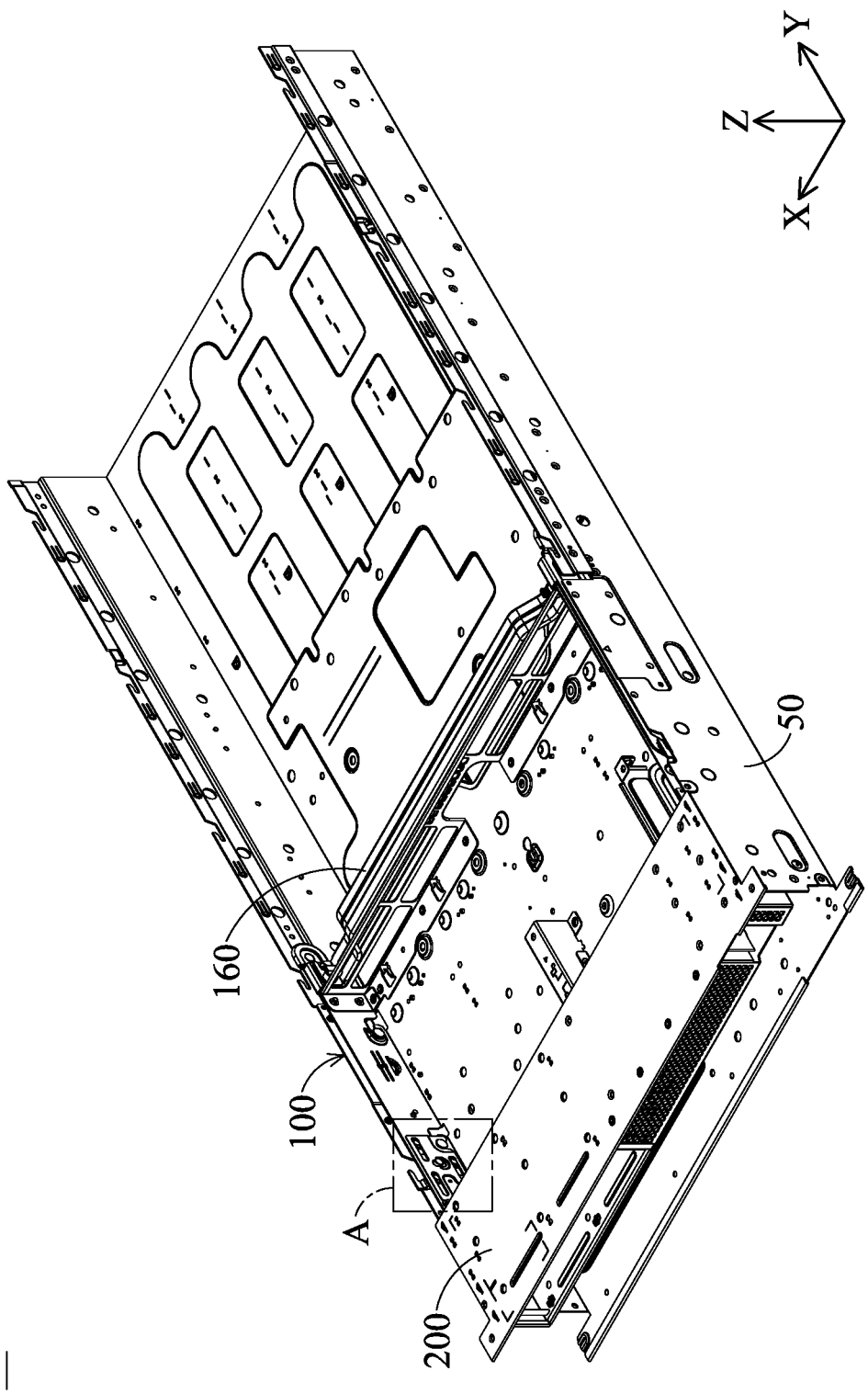

FIG. 1 illustrates a perspective view of an electronic device in accordance with some embodiments of the present disclosure.

Figure 2:
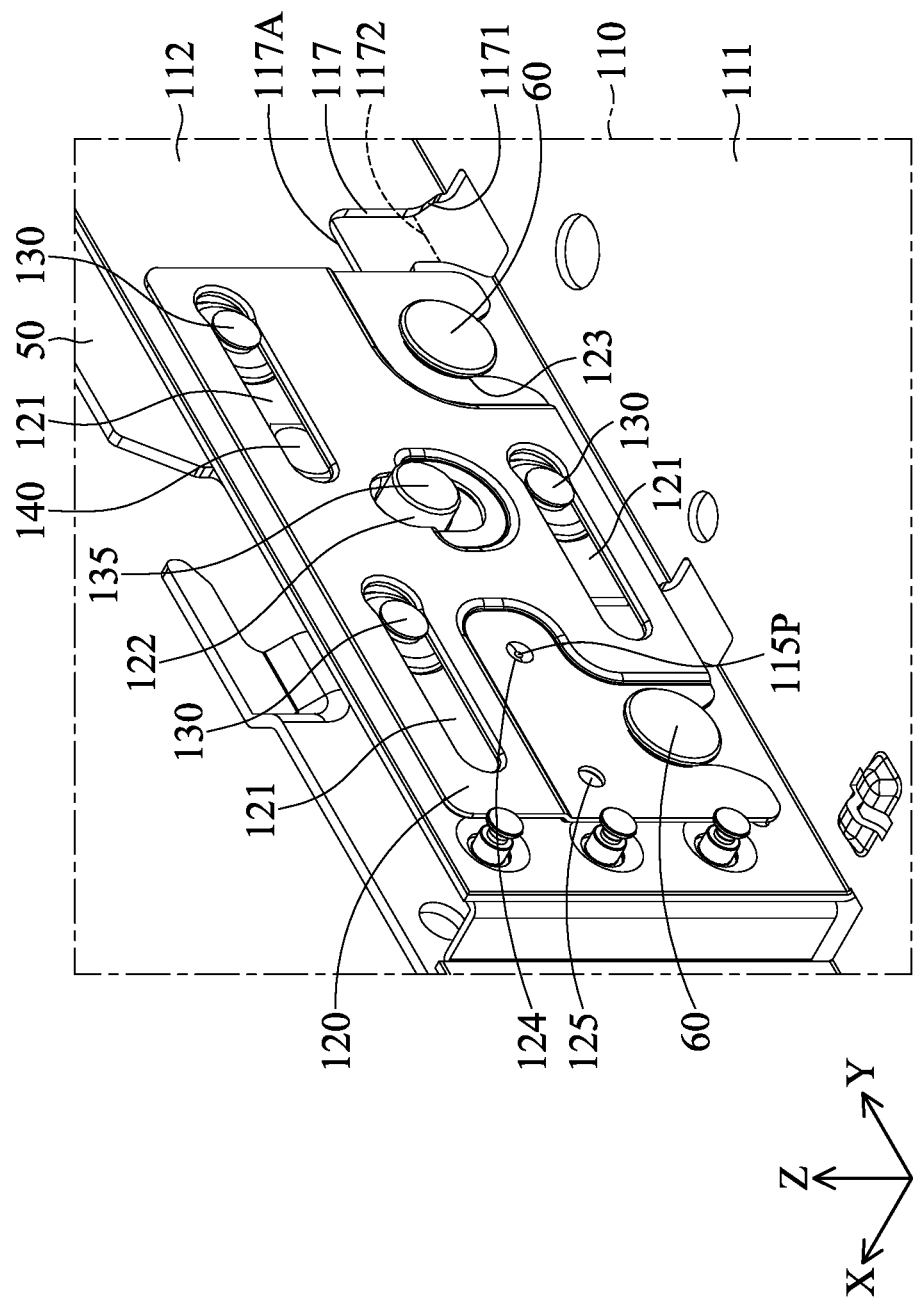

FIG. 2 illustrates a partial enlarged view of a region A of the electronic device shown in FIG. 1 in accordance with some embodiments of the present disclosure.

Figure 3:
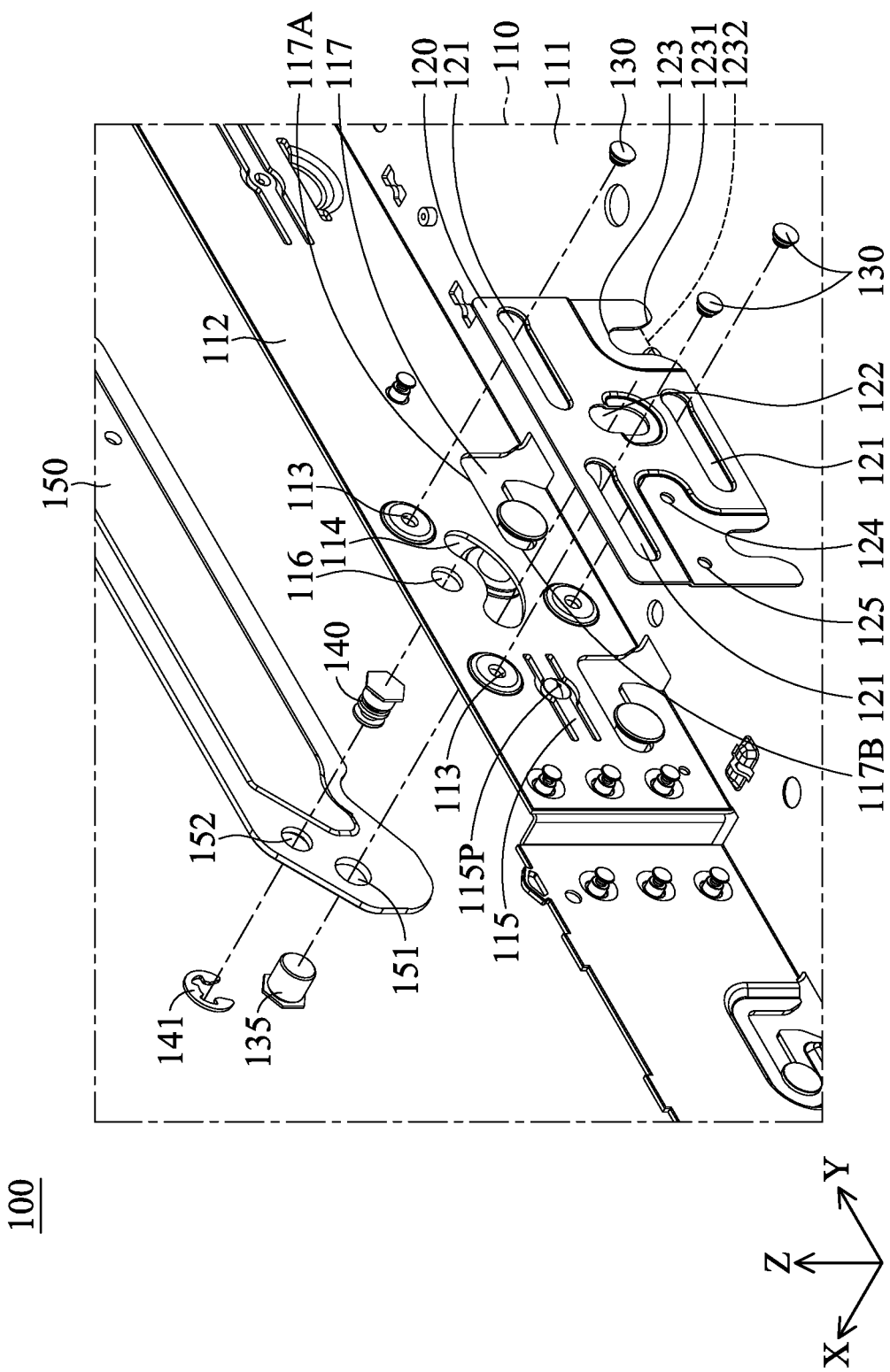

FIG. 3 illustrates a partial exploded view of a tray in accordance with some embodiments of the present disclosure.

Figure 4:
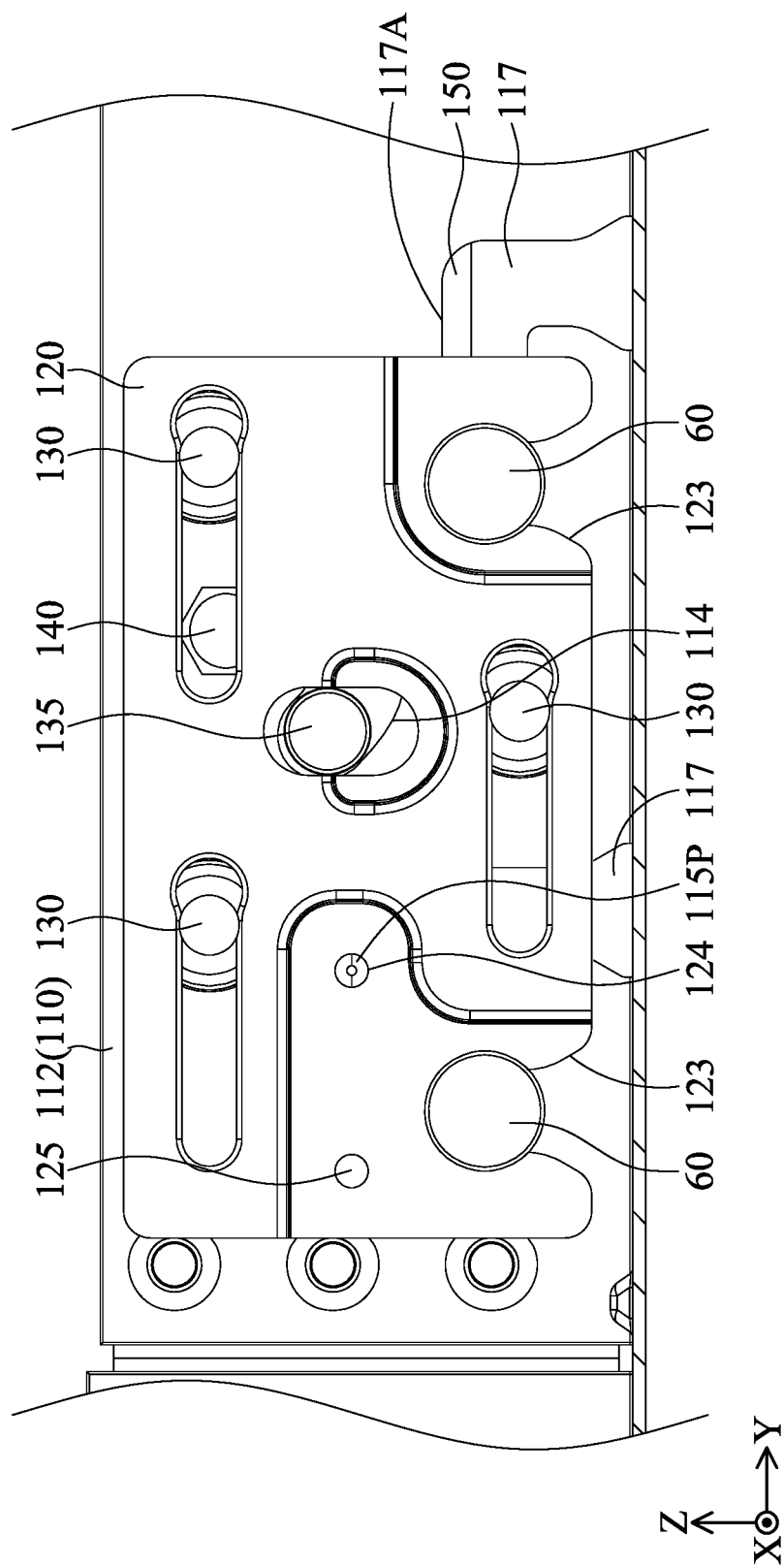

FIG. 4 illustrates a partial side view of the tray in accordance with some embodiments of the present disclosure.

Figure 5:
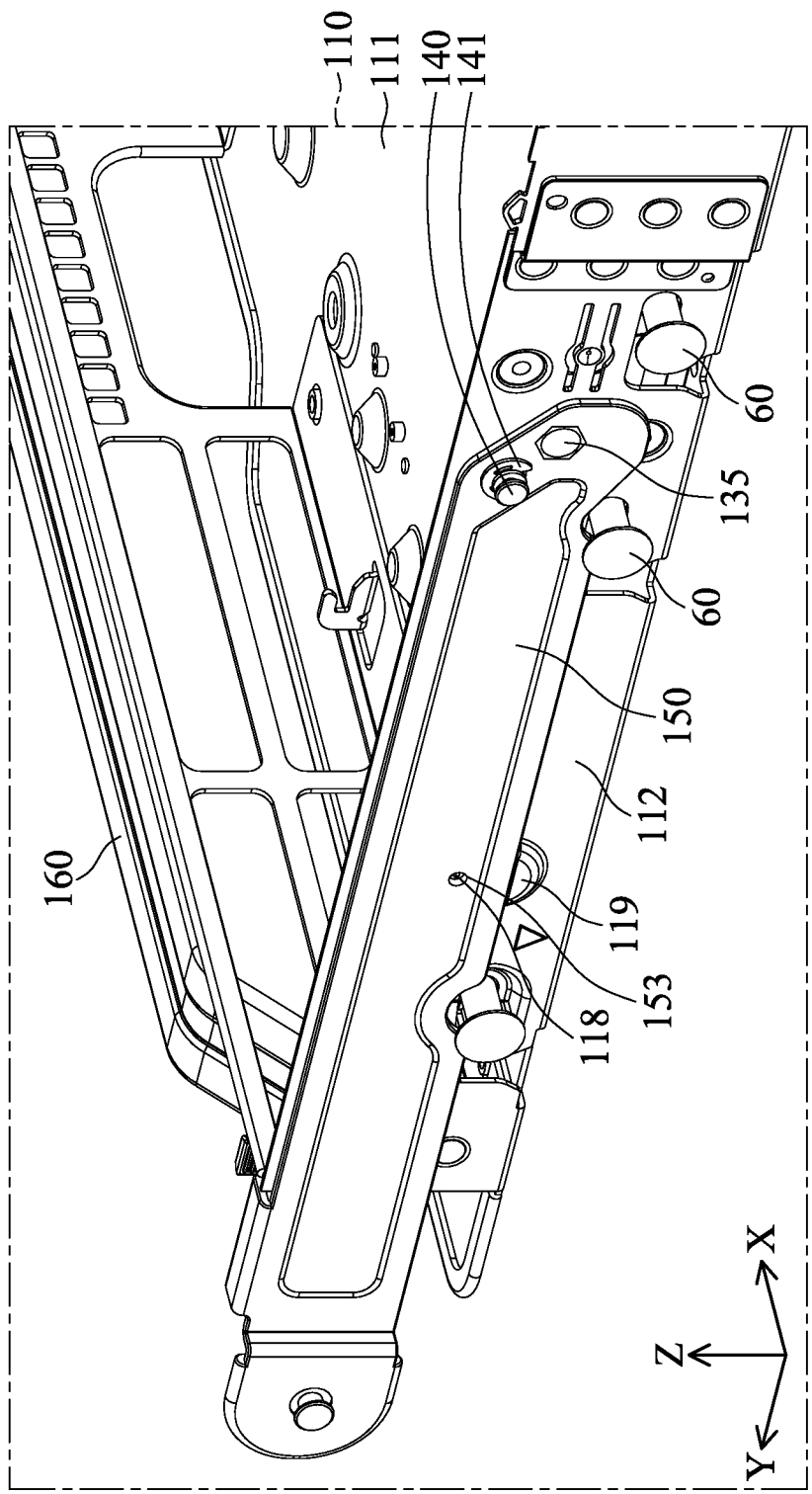

FIG. 5 illustrates a partial perspective view of the tray in accordance with some embodiments of the present disclosure.

Figure 6:
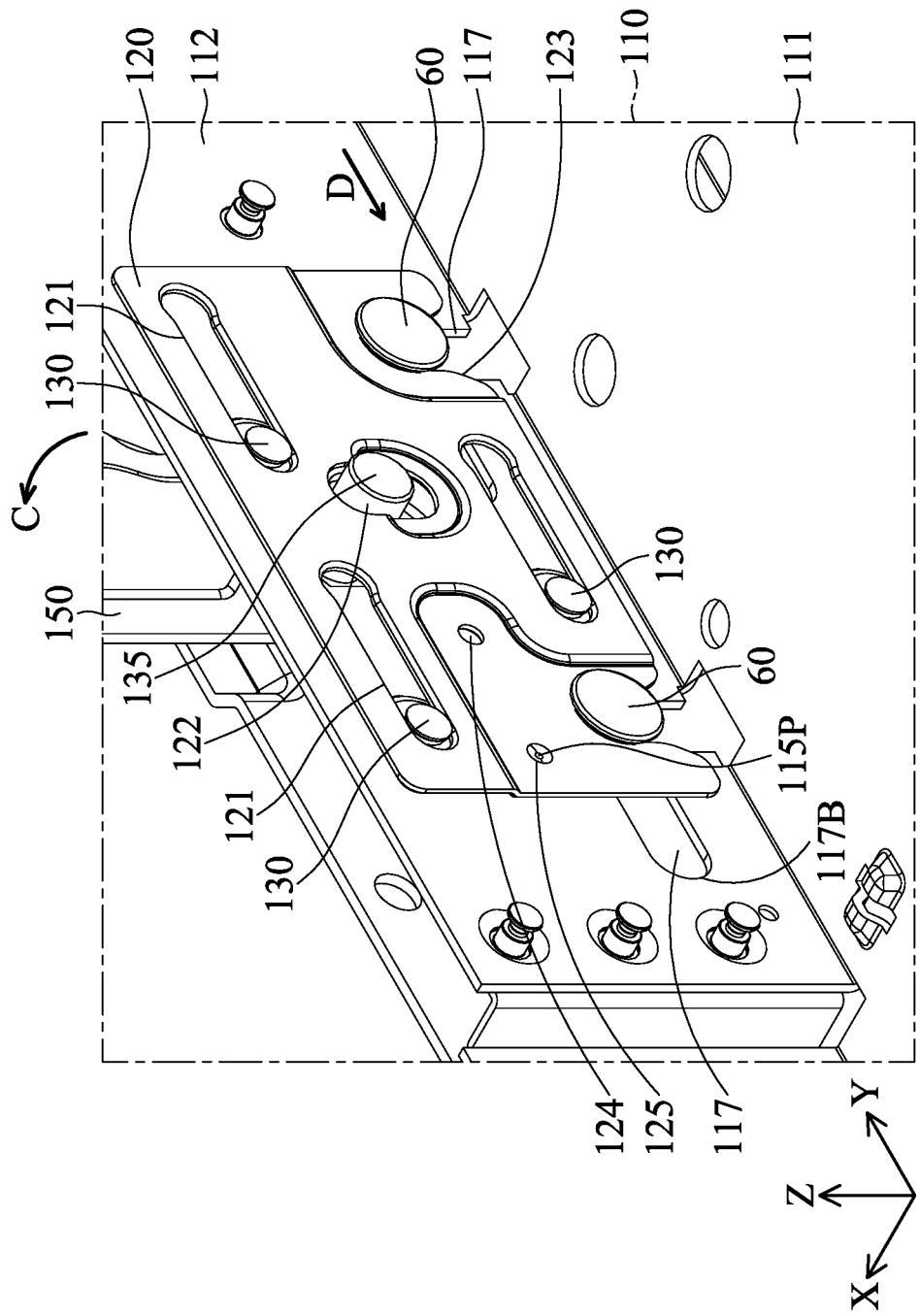

FIG. 6 illustrates a partial enlarged view of the region A of the electronic device shown in FIG. 1 in accordance with some embodiments of the present disclosure.

Figure 7:
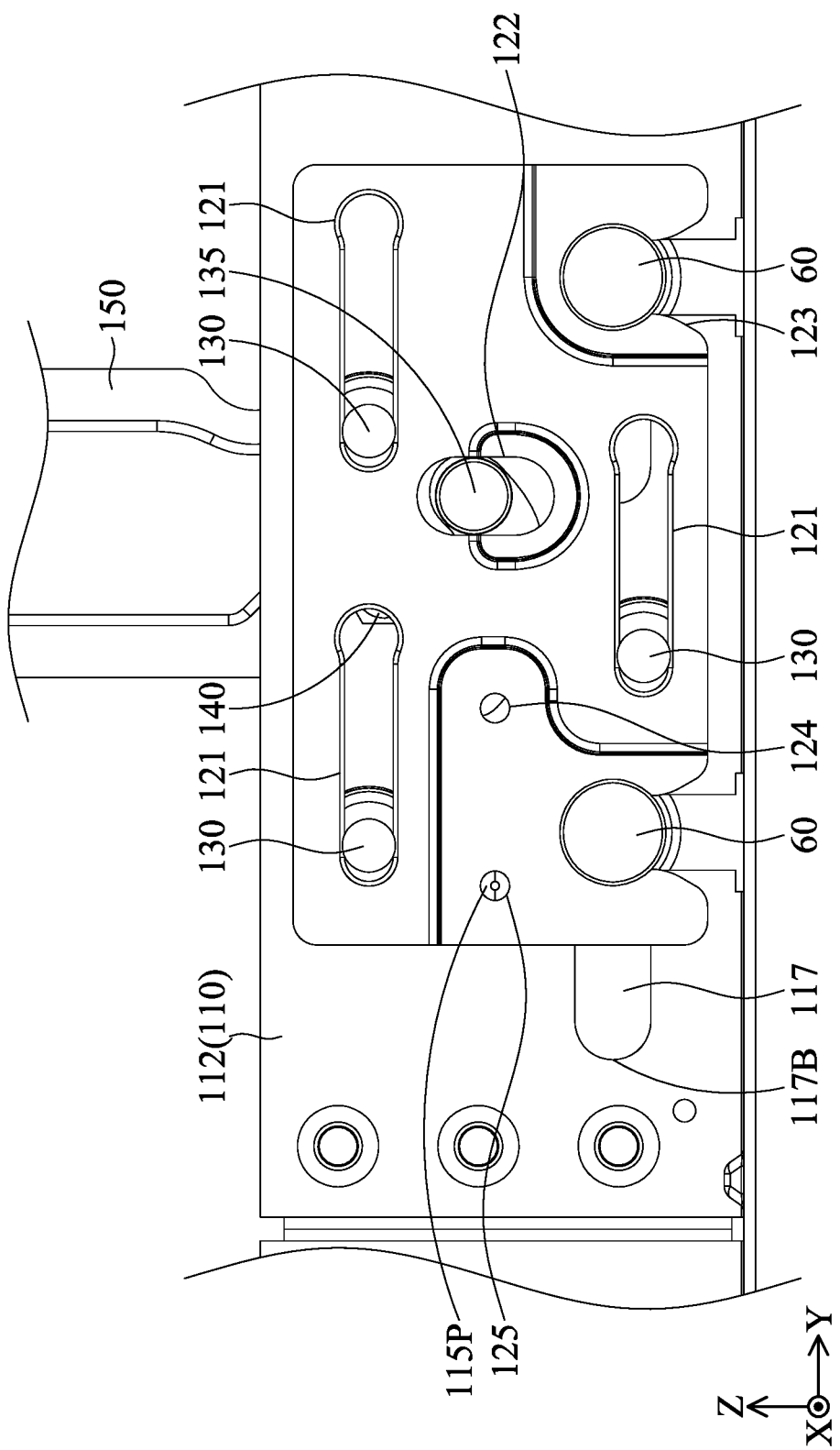

FIG. 7 illustrates a partial side view of the tray in accordance with some embodiments of the present disclosure.

Figure 8:
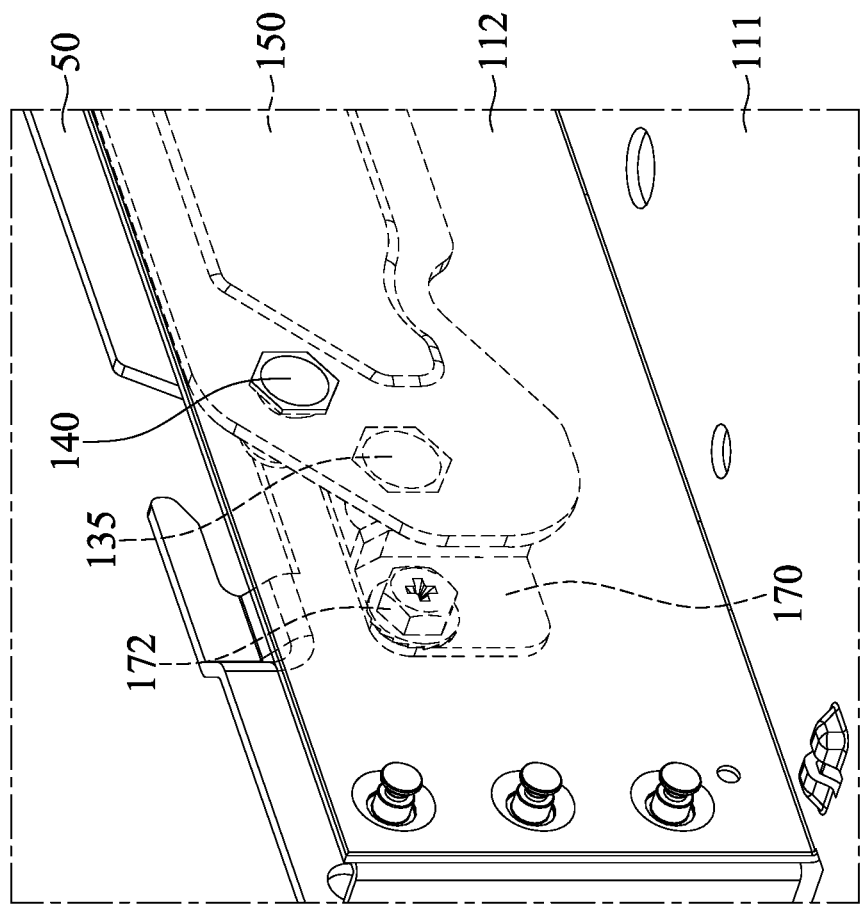

FIG. 8 illustrates a partial enlarged view of the region A of the electronic device shown in FIG. 1 in accordance with some embodiments of the present disclosure.

Figure 9:
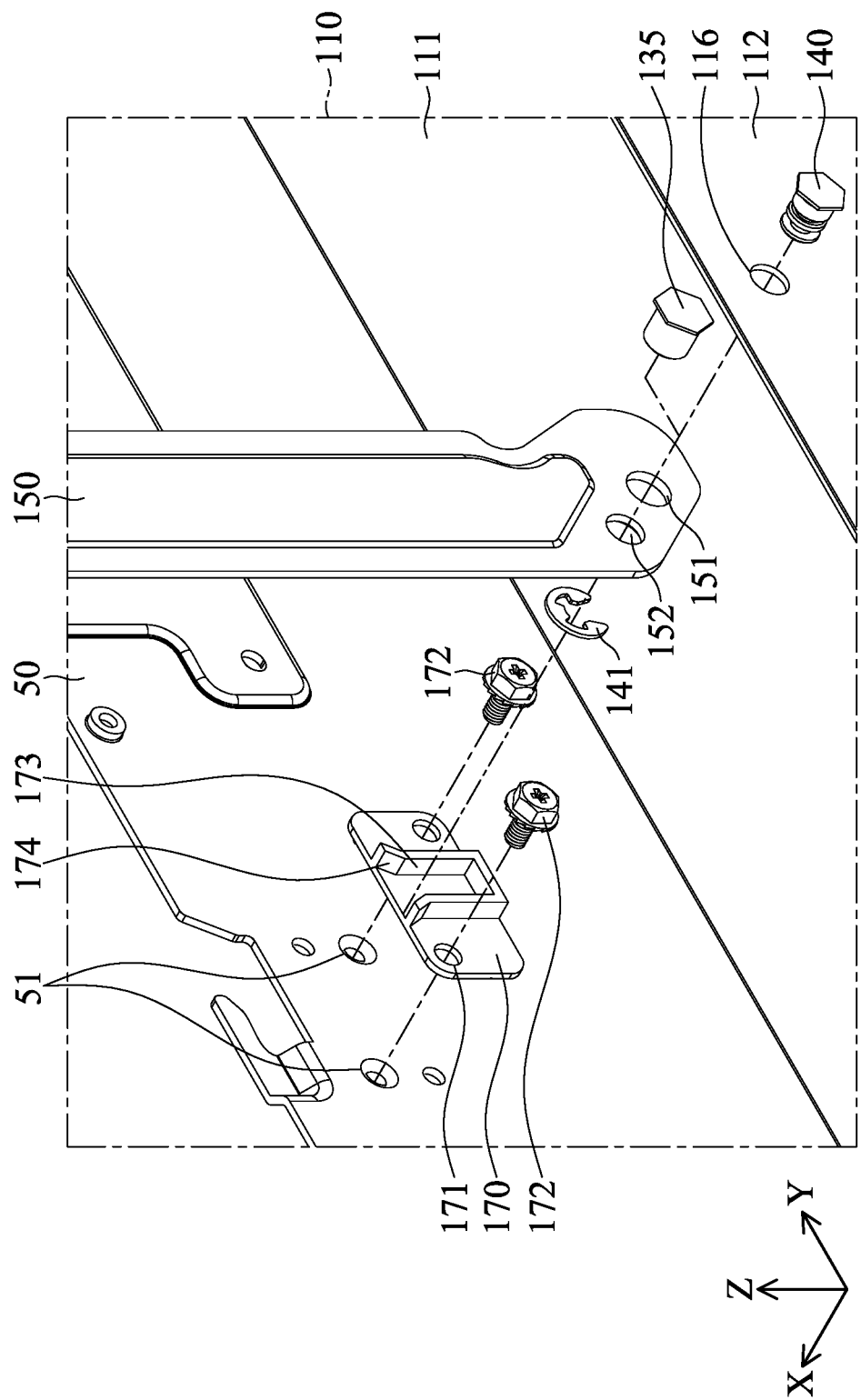

FIG. 9 illustrates a partial exploded view of a tray in accordance with some embodiments of the present disclosure.

Figure 10:
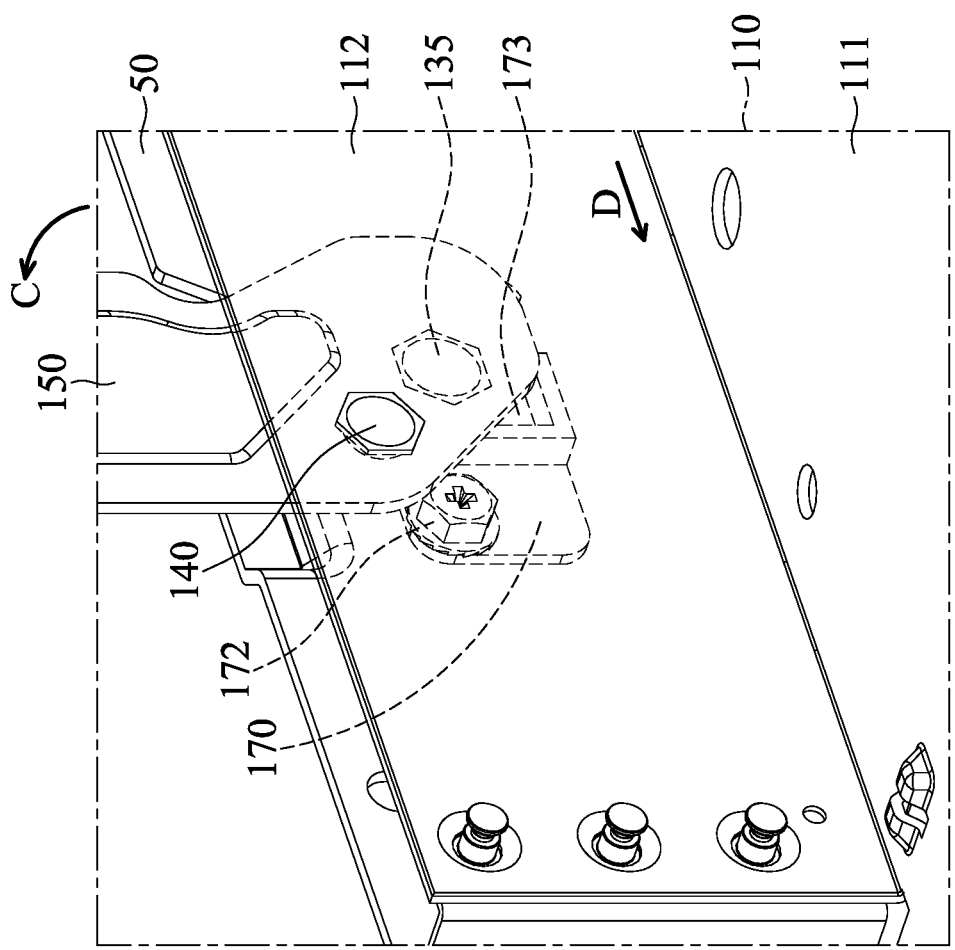

FIG. 10 illustrates a partial enlarged view of the region A of the electronic device shown in FIG. 1 in accordance with some embodiments of the present disclosure.

DETAILED DESCRIPTION OF THE INVENTION

The tray and the electronic device of some embodiments of the present disclosure are described in the following description. However, it should be appreciated that the following detailed description of some embodiments of the disclosure provides various concepts of the present disclosure which may be performed in specific backgrounds that may vary widely. The specific embodiments disclosed are provided merely to clearly describe the usage of the present disclosure by some specific methods without limiting the scope of the present disclosure.

In addition, relative terms such as "lower" or "bottom," "upper" or "top" may be used in the following embodiments in order to describe the relationship between one element and another element in the figures. It should be appreciated that if the device shown in the figures is flipped upside-down, the element located on the "lower" side may become the element located on the "upper" side.

It should be understood that although the terms "first," "second," etc. may be used herein to describe various elements, materials and/or portions, these elements, materials and/or portions are not limited by the above terms. These terms merely serve to distinguish different elements, materials and/or portions. Therefore, a first element, material and/or portion may be referred to as a second element, material and/or portion without departing from the teaching of some embodiments in the present disclosure. Unless defined otherwise, the first or second element, material and/or portion in the claims may be interpreted as any element, material and/or portion in the specification as long as it conforms to the description in the claims.

Unless defined otherwise, all terms (including technical and scientific terms) used herein have the same meaning as commonly understood by one of ordinary skill in the art to which the present disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "approximately" or "about" may also be recited in the present disclosure, and these terms are intended to encompass situations or ranges that is substantially or exact the same as the description herein. It should be noted that unless defined specifically, even if the above terms are not recited in the description, it should be read as the same meaning as those approximate terms are recited.

FIG. 1 illustrates a perspective view of an electronic device 10 in accordance with some embodiments of the present disclosure. It should be noted that the electronic device 10 may be any suitable electronic device, such as computer apparatus, server apparatus, etc., but it is not limited thereto. In some embodiments, the present disclosure merely illustrates a portion of the electronic device 10, and any electronic device that may include this portion is within the scope of the present disclosure. As shown in FIG. 1, the electronic device 10 includes a chassis 50, a tray 100 and an upper cover 200. The tray 100 may be disposed in the chassis 50 and may form an accommodating space with the upper cover 200 for accommodating electronic components (not shown). In some embodiments, the upper cover 200 may be omitted, and the electronic components may be disposed on the tray 100. The electronic components may be any kind of electronic components, depending on the function to be achieved, and therefore will not be described in detail in the following paragraphs. In addition, the tray 100 may include a handle 160 that is used to adjust the state of the tray 100 to facilitate mounting and unloading the electronic components. The detailed structure of the tray 100 will be described below with reference to the area A that is shown in FIG. 1.

FIG. 2 illustrates a partial enlarged view of the region A of the electronic device 10 shown in FIG. 1 in accordance with some embodiments of the present disclosure. It should be noted that, in order to show the detailed structure of the tray 100, the upper cover 200 is not shown in this embodiment. As shown in FIG. 2, the tray 100 includes a base 110 be used to accommodate in the chassis 50. In some embodiments, the base 110 may have a bottom surface 111 and a sidewall 112 that is substantially perpendicular to the bottom surface 111. The electronic components may be disposed on the base 110 and located in the space formed by the bottom surface 111 and the sidewall 112.

In addition, the base 110 may further have grooves 117 that are formed on the sidewall 112 to correspond to (e.g., accommodate) positioning members 60 of the chassis 50. In some embodiments, the grooves 117 may be L-shaped, extending from the bottom surface 111 in a vertical direction (e.g., the Z axis). For example, when the tray 100 is to be installed in the chassis 50, the grooves 117 may be aligned with the positioning members 60 to guide the tray 100 to move toward the chassis 50 in the Z-axis direction, so that the tray 100 may be installed in the chassis 50. In some embodiments, after the installation of the tray 100 is completed, the positioning members 60 may abut against the upper edges 117A of the grooves 117. For example, the upper edges 117A of the grooves 117 may be edges located at the top of the grooves 117 and substantially perpendicular to the Z-axis. In some embodiments, the positioning members 60 may be rivets forming protrusions, which fit with the grooves 117 of the base 110. As shown in FIG. 2, the tray 100 may be installed so that the positioning members 60 are each located at a limit position in the grooves 117, and therefore the user would know that the tray 100 has been correctly positioned. As such, the user may be guided to align the tray 100 with the chassis 50, which reduces the difficulty for the user to install the tray 100, and further reduces the probability of damage to the tray 100 due to improper installation.

The base 110 of the tray 100 is movable relative to the positioning members 60 to switch between different states selectively. It is noted that the term "selectively" in the present disclosure may be referred to "the operation is controlled by the users." More specifically, the grooves 117 may extend in a horizontal direction (e.g., the Y axis) to define the movable range of the base 110. In some embodiments, the tray 100 is movable relative to the positioning members 60 in the Y-axis direction and abut against the inner edges 117B of the grooves 117 (for example, see FIG. 3), so as to restrict the movement of the tray 100 relative to the chassis 50 in the Z-axis direction. Thereby, the tray 100 may be kept on the chassis 50, and the tray 100 cannot be taken out (e.g., in the Z-axis direction), forming a locked state. In some embodiments, in the above locked state, the sidewall 112 (e.g., the inner edges of the grooves 117) may abut against the positioning members 60, but the present disclosure is not limited thereto. In some embodiments, the grooves 117 may have a guiding surface 1171 that tapers from the groove openings 1172 facing the bottom surface 111 to the upper edges 117A of the grooves 117. In this way, the difficulty for the positioning members 60 to enter the grooves 117 may be reduced. For example, the inner edges 117B may be a curved edge, or may have a shape that matches the shape of the positioning members 60. In some embodiments, the inner edges 117B of the grooves 117 may be each connected to the upper edges 117A of the grooves 117.

In addition, the tray 100 also includes a bracket 120 and a plurality of pins 130. The bracket 120 and the pins 130 are each disposed on the inner side of the sidewall 112 of the base 110, and the pins 130 are connected between the bracket 120 and the base 110. The bracket 120 includes a plurality of slots 121 that correspond to different pins 130 respectively. In some embodiments, the slots 121 may extend along a horizontal direction (e.g., the Y-axis), and the pins 130 are slidably disposed in the corresponding slots 121.

Moreover, the bracket 120 has recesses 123 that are used to accommodate the positioning members 60, and the recesses 123 extend from the lower edge of the bracket 120 in a vertical direction (e.g., the Z-axis). Therefore, when the recesses 123 are aligned with the positioning members 60, the positioning members 60 abut against the upper edges of the recesses 123. In the above-mentioned locked state, the positioning members 60 also abut against the inner edges 117B of the grooves 117 and therefore cannot move. Therefore, the tray 100 is kept fixed and cannot be removed from the chassis 50. Similar to the grooves 117, the recesses 123 may each have a guiding surface 1231, and the guiding surface 1231 tapers from the recess opening 1232 facing the bottom surface 111 to the upper edge (referring to FIG. 3). Accordingly, the difficulty for the positioning members 60 to enter the recesses 123 may be reduced.

In some embodiments, the tray 100 includes a linking member 135 that may be disposed in a through groove 122 of the bracket 120. In some embodiments, the linking member 135 may be, for example, a columnar structure, which penetrates through the sidewall 112 of the base 110 and the bracket 120. In some embodiments, the dimension of the through groove 122 on a plane (e.g., the Y-Z plane that is substantially parallel to the sidewall 112) is larger than the dimension of the linking member 135 on the same plane, so that the linking member 135 is movable in the through groove 122. For example, the through groove 122 may have a substantially elliptical profile, and the major axis (e.g., parallel to the Z-axis) of the through groove 122 may be substantially perpendicular to the moving direction (e.g., parallel to the Y axis) of the base 110. In some embodiments, the linking member 135 may abut against the inner edge of the through groove 122, thereby reducing the probability of the linking member 135 moving in an unexpected direction. In other embodiments, a gap may be formed between the linking member 135 and the inner edge of the through groove 122, thereby reducing the difficulty of assembling the linking member 135 and the bracket 120. As set forth above, in the above locked state, the position of the bracket 120 is fixed due to the arrangement of the positioning members 60, so the movement of the linking member 135 will push the sidewall 112 of the base 110 and further drive the tray 100 to move. The operation of the linking member 135 will be further described below.

FIG. 3 illustrates a partial exploded view of the tray 100 in accordance with some embodiments of the present disclosure. As shown in FIG. 3, the sidewall 112 of the base 110 has a plurality of holes 113, a chute 114, an elastic arm 115 and a hole 116. Each of the holes 113 can be respectively provided for the pins 130, that is, the pins 130 pass through the holes 113 of the base 110 and the slots 121 of the bracket 120. The chute 114 is used to accommodate the linking member 135, and the linking member 135 is movable within the chute 114. The profile of the chute 114 may define the movable range of the linking member 135. For example, the profile of the chute 114 may be substantially arc-shaped (e.g., centered on the hole 116), but the present disclosure is not limited thereto. In addition, the elastic arm 115 may have a bump 115P, which is elastically movable between holes 124 and 125 of the bracket 120. In some embodiments, in the locked state, the bump 115P may be accommodated in the hole 124 (e.g., which is closer to the through groove 122 than the hole 125), but the present disclosure is not limited thereto.

Although the configuration of the base 110 is described above, this embodiment is merely an example, and those skilled in the art may adjust the configuration of the base 110 based on the present disclosure (for example, for matching the shape of the chassis 50, these different configurations are also included within the scope of the present disclosure.

In addition, the tray 100 further includes a shaft 140 and a connecting rod 150. The connecting rod 150 may be used to connect with the handle 160 (referring to FIG. 1), so that the user can control the position of the base 110 by operating the handle 160. Specifically, the connecting rod 150 may connect the base 110 (e.g., the sidewall 112) and the bracket 120 via the linking member 135. The connecting rod 150 has a hole 151 and another hole 152. The linking member 135 may pass through the hole 151 of the connecting rod 150, the chute 114 of the base 110 and the through groove 122 of the bracket 120. The shaft 140 passes through the hole 152 of the connecting rod 150 and the hole 116 of the base 110, and serves as the central axis of the rotation of the connecting rod 150. As a result, when the connecting rod 150 (and the handle 160) rotates, the linking member 135 may be driven to move. In some embodiments, an E-ring 141 may be disposed to strengthen the fixation between the shaft 140 and the connecting rod 150, but it should be understood that those skilled in the art may use other suitable structures to combine the shaft 140 and the connecting rod 150, and these structures are all within the scope of the present disclosure. In some embodiments, the distance (the applying moment arm) between the handle 160 and the shaft 140 is greater than the distance between the linking member 135 and the shaft 140 (the resisting moment arm), so as to that the applying moment arm is larger than the resisting moment arm, achieving the labor-saving effect, the user may easily rotate the handle 160 to drive the linking member 135 and the bracket 120 to move.

FIG. 4 illustrates a partial side view of the tray 100 in accordance with some embodiments of the present disclosure. As shown in FIG. 4, when in the locked state, viewed from a direction (e.g., the X-axis) that is perpendicular to the sidewall 112, the connecting rod 150 may be partially exposed from the grooves 117. In addition, the linking member 135 and the shaft 140 may be located in a region surrounded by a plurality of pins 130 (e.g., a triangular region), but the present disclosure is not limited thereto. In some embodiments, a line connecting center points of the hole 124 and the hole 125 of the bracket 120 may extend through the linking member 135. In some embodiments, the upper edge of the bracket 120 may be lower than the upper edge of the sidewall 112, thereby helping to protect the bracket 120 from collision with other components. In other embodiments, the upper edge of the bracket 120 may be substantially leveled with the upper edge of the sidewall 112.

FIG. 5 illustrates a partial perspective view of the tray 100 in accordance with some embodiments of the present disclosure. As shown in FIG. 5, a bump 118 is formed on the sidewall 112 and protrudes toward the connecting rod 150, and the connecting rod 150 has a positioning hole 153 corresponding to and accommodating the bump 118. When the connecting rod 150 is parallel to the sidewall 112 (i.e., in the locked state), the positioning hole 153 on the connecting rod 150 may correspond to and accommodate the bump 118. In addition, a stopper portion 119 is formed on the sidewall 112, and the stopper portion 119 may extend from the sidewall 112 of the tray 100 to the chassis 50. When the connecting rod 150 has well positioned, the connecting rod 150 may abut against the stopper portion 119. The above features may provide the user with a clearer feedback and reduce the probability of improper operation by the user. The bump 118 may have a certain flexibility, so that when the user pulls the handle 160, the bump 118 may smoothly leave the positioning hole 153 of the connecting rod 150. For example, the material of the connecting rod 150 may include metal or any other suitable material.

FIG. 6 illustrates a partial enlarged view of the region A of the electronic device 10 shown in FIG. 1 in accordance with some embodiments of the present disclosure. As shown in FIG. 6, the user may push the handle 160. When the handle 160 is lifted, the connecting rod 150 may be driven to rotate around the shaft 140 (e.g., rotate in the direction C). At this time, the connecting rod 150 will also drive the linking member 135 to move. When the bracket 120 is affixed in the chassis 50, the linking member 135 may push the base 110 to rotate and move in the direction D to a free state. More specifically, the connecting rod 150 can drive the linking member 135 to move in an arc-shaped trajectory (along the chute 114) around the shaft 140. During the movement of the linking member 135, the linking member 135 is movable within the through groove 122 of the bracket 120.

In this free state, the base 110 may be moved to expose the positioning members 60 from the openings of the grooves 117 and the recesses 123. In this way, when the tray 100 is taken out from the chassis 50, the positioning members 60 may pass through the grooves 117 and the recesses 123, so that the tray 100 may be taken out smoothly without being hindered by the positioning members 60. It should be understood that the user may set the tray 100 to the locked state by reversely taking the above steps, which will not be described in detail below. In summary, the user may set the tray 100 to the locked state or the free state by pushing the handle 160 in response to different usage situations. In addition, when the tray 100 is not installed in the chassis 50 and is not engaged with the positioning members 60, the bracket 120 is not limited by the positioning members 60 and is movable relative to the base 110. Therefore, pulling the handle 160 at this time will push the bracket 120 to move relative to the base 110.

FIG. 7 illustrates a partial side view of the tray 100 in accordance with some embodiments of the present disclosure. As shown in FIG. 7, since the elastic arm 115 (referring to FIG. 3) is flexible, the bump 115P of the elastic arm 115 may move away from the hole 124 along with the movement of the base 110. When the base 110 is shifted to the above-mentioned free state, the bump 115P of the elastic arms 115 may be accommodated in the hole 125 (which is, for example, farther away from the through grooves 122 than the hole 124). As a result, an appropriate feedback may be provided for the user, whereby it is possible to know whether the tray 100 (the base 110) has been set to the free state.

FIG. 8 illustrates a partial enlarged view of the region A of the electronic device shown in FIG. 1 in accordance with some embodiments of the present disclosure. It should be noted that the tray 100 shown in this embodiment may have a similar structure to the tray 100 shown in FIGS. 2 to 7, and these similar structures will be denoted by the same reference numerals, and will not be discussed in detail below. In this embodiment, the bracket 120 is replaced by the bracket 170. In order to show the structure of the bracket 170, the base 110 is shown in a perspective manner. For example, the bracket 170 may be affixed to the chassis 50 by the fixing members 172. In this embodiment, the structure of the base 110 is different from the structure of the base 110 shown in FIGS. 2 to 7. For example, the sidewall 112 of the base 110 merely retains a hole (e.g., the hole 116) provided for the shaft 140. However, in other embodiments, the base 110 as shown in FIGS. 2 to 7 may still be used to reduce cost and/or complexity of the assembly.

FIG. 9 illustrates a partial exploded view of the tray 100 in accordance with some embodiments of the present disclosure. As shown in FIG. 9, the bracket 170 may have holes 171 and a recess 173, and the fixing members 172 may each pass through the holes 171 of the bracket 170 and the holes 51 of the chassis 50, thereby affixing the bracket 170 on the chassis 50. The recess 173 may be disposed corresponding to the linking member 135. More specifically, in this embodiment, the linking member 135 may pass through the hole 151 of the connecting rod 150 and be accommodated in the recess 173. For example, the linking member 135 may abut against the sidewall of the recess 173. In addition, the recess 173 may have a guiding surface 174, so as to mitigate the difficulty for the linkage 135 to enter the recess 123.

FIG. 10 illustrates a partial enlarged view of the region A of the electronic device 10 shown in FIG. 1 in accordance with some embodiments of the present disclosure. As shown in FIG. 10, the user may push the handle 160. When the handle 160 is lifted, the connecting rod 150 may be driven to rotate around the shaft 140 (e.g., rotate in the direction C). At this time, the connecting rod 150 will also drive the linking member 135 to move. When the bracket 170 is affixed to the chassis 50, the linking member 135 may push the base 110 to rotate and move in the direction D to a free state. More specifically, the connecting rod 150 may drive the linking member 135 to move up and down along the recess 173. Since the bracket 170 (including the recess 173) is affixed to the chassis 50, the recess 173 may provide a sufficient force for the linkage 135 to push the base 110.

In summary, the present disclosure provides a tray and an electronic device that are capable of switching between different states. In some embodiments, the tray may include a linking member that is used to drive the base to move to different positions, thereby facilitating installation or removal of the tray. The tray may also include a bracket and a connecting rod that are connected to the linking member, which helps the user to adjust the position of the linking member. In addition, the connecting rod connecting the linking member is rotatable around the shaft, and cooperates with the handle to form a labor-saving structure for the user. The base and the bracket may form a structure corresponding to the linking member, so as to ensure the smooth operation of the linking member.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A tray, provided for an electronic device, comprising:
    a base having a bottom surface and a sidewall connected to the bottom surface, wherein the base has a groove for accommodating a positioning member of the electronic device, and the groove is L-shaped;
    a connecting rod rotatably disposed on the sidewall of the base;
    a bracket disposed adjacent to the base; and
    a linking member disposed on the connecting rod and movably connected to the bracket;
    wherein the tray is moved relatively to the electronic device by the linking member through the connecting rod selectively.

2. The tray as claimed in claim 1, further comprising a plurality of pins, wherein the bracket comprises a plurality of slots, each of the pins is accommodated in one of the slots and affixed to the sidewall of the base.

3. The tray as claimed in claim 2, wherein the bracket has a through groove, the linking member is slidably disposed in the through groove, and a dimension of the through groove on a plane is different from a dimension of the linking member on the plane.

4. The tray as claimed in claim 3, wherein the base has a chute, the chute has a curved shape, and the linking member is slidably disposed in the chute.

5. The tray as claimed in claim 2, wherein the bracket has a recess, and when the tray is provided in the electronic device, the groove and the recess cooperate to accommodate the positioning member of the electronic device.

6. The tray as claimed in claim 1, wherein the base has a stopper portion protruding from the sidewall, and the stopper portion abuts against the connecting rod selectively.

7. The tray as claimed in claim 1, wherein the base has an elastic arm, a bump is formed on the elastic arm, and the bump protrudes toward the bracket and corresponds to a hole in the bracket.

8. The tray as claimed in claim 1, wherein the base has a bump protruding toward the connecting rod and corresponding to a hole in the connecting rod.

9. The tray as claimed in claim 1, wherein the bracket is affixed to the electronic device and the bracket has a recess, when the tray is provided in the electronic device, the linking member is accommodated in the recess.

10. An electronic device, comprising:
    a chassis, comprising a positioning member; and
    a tray, removably disposed in the chassis, comprising:
    a base having a bottom surface and a sidewall connected to the bottom surface, wherein the base has a groove for accommodating the positioning member, and the groove is L-shaped;
    a connecting rod rotatably disposed on the sidewall of the base;
    a bracket disposed adjacent to the base; and
    a linking member disposed on the connecting rod and movably connected to the bracket relatively to the chassis by the linking member through the connecting rod selectively.

11. The electronic device as claimed in claim 10, wherein the bracket has a recess, the groove and the recess cooperate to accommodate the positioning member, and when the positioning member slides within the groove, the recess of the bracket limits the positioning member, and the bracket is pushed by the positing member to move relatively to the chassis.

12. The electronic device as claimed in claim 10, wherein the base has chute, the bracket has a through groove, the linking member passes through the chute and the through groove, and a profile of the through groove is different from a profile of the chute.

13. The electronic device as claimed in claim 10, wherein the base has a bump protruding toward the connecting rod and corresponding to a hole in the connecting rod.

14. The electronic device as claimed in claim 10, wherein the base has an elastic arm, a bump is formed on the elastic arm, and the bump protrudes toward the bracket and corresponds to a hole in the bracket.

15. The electronic device as claimed in claim 10, wherein the bracket is affixed to the chassis and the bracket has a recess, when the tray is provided in the electronic device, the linking member is accommodated in the recess.

16. The electronic device as claimed in claim 10, further comprising a handle connected to the connecting rod and the connecting rod is driven by the handle to rotate relatively to the base selectively.

17. A tray, comprising:
    a base having a bottom surface and a sidewall connected to the bottom surface, wherein the base has a groove for accommodating a positioning member of an electronic device, and the groove is L-shaped;
    a connecting rod rotatably disposed on the sidewall of the base;
    a bracket disposed adjacent to the base; and
    a linking member disposed on the connecting rod and movably connected to the bracket;
    wherein the tray is driven for a relative motion between the base and the bracket by the linking member through the connecting rod selectively.

18. The tray as claimed in claim 17, further comprising a plurality of pins, wherein the bracket comprises a plurality of slots, each of the pins is accommodated in one of the slots and affixed to the sidewall of the base.

19. The tray as claimed in claim 17, wherein the bracket has a through groove, the linking member is slidably disposed in the through groove, and a dimension of the through groove on a plane is different from a dimension of the linking member on the plane.

20. The tray as claimed in claim 17, wherein the base has an elastic arm, a bump is formed on the elastic arm, and the bump protrudes toward the bracket and corresponds to a hole in the bracket.

* * * * *